(12) United States Patent
Lauffer et al.

(10) Patent No.: US 6,479,093 B2
(45) Date of Patent: Nov. 12, 2002

(54) COMPOSITE LAMINATE CIRCUIT STRUCTURE AND METHODS OF INTERCONNECTING THE SAME

(75) Inventors: John M. Lauffer, Waverly; Voya R. Markovich; Thomas R. Miller, both of Endwell; Konstantinos I. Papathomas, Endicott; William E. Wilson, Waverly, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/062,100

(22) Filed: Jan. 31, 2002

(65) Prior Publication Data

US 2002/0098331 A1 Jul. 25, 2002

Related U.S. Application Data

(62) Division of application No. 09/651,010, filed on Aug. 29, 2000, now Pat. No. 6,388,204.

(51) Int. Cl.[7] .................................................. B05D 5/12
(52) U.S. Cl. .......................................... 427/96; 427/97
(58) Field of Search ............................... 427/97, 98, 96

(56) References Cited

U.S. PATENT DOCUMENTS

| | | | |
|---|---|---|---|
| 5,026,624 A | 6/1991 | Day et al. | 430/280 |
| 5,129,042 A | 7/1992 | Jeong | 395/27 |
| 5,191,174 A | 3/1993 | Chang et al. | 174/266 |
| 5,229,550 A | 7/1993 | Bindra et al. | 174/262 |
| 5,300,402 A | 4/1994 | Card, Jr. et al. | 430/280 |
| 5,435,057 A | 7/1995 | Bindra et al. | 29/830 |
| 5,509,200 A | 4/1996 | Frankeny et al. | 29/852 |
| 5,558,928 A | 9/1996 | DiStefano et al. | 428/209 |
| 5,677,576 A | 10/1997 | Akagawa | 257/785 |
| 5,745,533 A | 4/1998 | Asada et al. | 375/354 |
| 5,817,404 A | 10/1998 | Kawakita et al. | 428/209 |
| 5,876,842 A | 3/1999 | Duffy et al. | 428/209 |

Primary Examiner—Cathy Lam
(74) Attorney, Agent, or Firm—Lawrence R. Fraley

(57) ABSTRACT

A laminate circuit structure assembly is provided that comprises at least two modularized circuitized plane subassemblies; a joining layer located between each of the subassemblies and wherein the subassemblies and joining layer are bonded together with a cured dielectric from a bondable, curable dielectric. The subassemblies and joining layer are electrically interconnected with bondable electrically conductive material. The joining layer comprises dielectric layers disposed about an internal electrically conductive layer. The electrically conductive layer has a via and the dielectric layers each have a via of smaller diameter than the vias in the electrically conductive layer and are aligned with the vias in the electrically conductive layer. The vias are filled with electrically bondable electrically conductive material for providing electrical contact between the subassemblies.

17 Claims, 3 Drawing Sheets

COMPOSITE LAMINATE CIRCUIT STRUCTURE AND METHODS OF INTERCONNECTING THE SAME

CROSS-REFERENCE TO COPENDING APPLICATION

This application is a divisional application of Ser. No. 09/651,010, filed Aug. 29, 2000 and entitled, "Composite Laminate Circuit Structure And Methods Of Interconnecting The Same". Inventors are John M. Lauffer et al, now U.S. Pat. No. 6,388,204.

TECHNICAL FIELD

The present invention relates to laminate circuit structures, and more particularly to composite laminate circuit structures from a plurality of modularized circuitized plane subassemblies having a joining layer between each adjacent pair of subassemblies and being bonded together. The present invention also relates to a method for fabricating the laminate circuit structures. The present invention provides for planar, fine line external circuit flatlines and does not require plated through holes or copper plating of the composite structure.

BACKGROUND OF INVENTION

A conventional technique of forming a laminate circuit board structures includes forming layers of dielectric material and electrically conducting material to provide multiple layers of circuits and voltage planes. Voltage planes can be either ground plane or power planes, and are sometimes collectively referred to as power planes. In one technique of forming such structure, layers of dielectric material and conducting material successively applied, i.e. the dielectric material is applied and then voltage planes are supplied thereon and if necessary through holes formed by the drilling or etching of through holes or blind vias. This technique relies on each successive step adding additional structure and the circuitry layers are formed individually; i.e., in each step in forming the plane having circuit traces on formed power planes. This requires precision drilling to form the plated through holes all of which is time consuming, especially where there is a large number of drilled holes required to form plated through holes.

More recently, techniques have been described that provide a relatively inexpensive photolithographic technique of forming a composite laminate structure from individual discrete laminate structures into a composite laminate structure.

Along these lines see U.S. Pat. No. 6,204,453 entitled "Two Signal One Power Plane Circuit Board," U.S. Pat. No. 6,201,194 entitled "Multi-Layer Organic Chip Carrier Package" and U.S. Pat. No. 6,175,087 entitled "Composite Laminate Circuit and Method of Forming the Same," entire disclosures of which are incorporated herein by reference. Although the structures and methods of these inventions provide significant advances and advantages over current printed wire board (PWB) fabrication methods, there still exists a need for further refinement. Therefore continuing efforts are underway in attempting to provide for even greater advantages.

SUMMARY OF INVENTION

The present invention makes possible laminate circuit structures being more robust and less costly. The present invention provides for reduced cost since copper plating of the composite structure is no longer required and plated through holes are not needed. Moreover, alignment of the various sub-elements is not as critical since the need to maintain a minimum through hole diameter to get copper plating solution through no longer exists.

More particularly, the laminate circuit structure assembly of the present invention composes at least two modularized circuitized plane subassemblies wherein each of the subassemblies comprise at least two planes having circuit traces disposed about an internal circuitized plane. The at least two planes each have an external surface and an internal surface. Dielectric material is located between the circuit traces and circuitized plane. At least one via is disposed within each subassembly for providing electrical communication between the planes having circuit traces and electrical connection to another of the subassemblies. The vias are filled with a bondable electrically conductive material. Dielectric is also present on each external surface of each plane and having a via filled with a bondable electrically conductive material. The bondable electrically conductive material in the dielectric is aligned with and contacts the bondable electrically conductive material in the vias in the planes having circuit traces for providing electrical connection to another of the subassemblies.

A joining layer is located between each of the subassemblies wherein the joining layer comprises dielectric layers disposed about an internal electrically conductive layer wherein the electrically conductive layer has a via and the dielectric layers each have a via of smaller diameter than the via in the electrically conductive layer and aligned with the via in the electrically conductive layer. The vias in the dielectric layers and electrically conductive layers are filled with a bondable electrically conductive material for providing electrical contact between the subassemblies.

The subassemblies and joining layer are bonded together with a cured dielectric from a bondable dielectric and are interconnected with a conductive member.

The present invention also relates to a method for fabricating a laminate circuit structure assembly. The method comprises providing at least two modularized circuitized plane subassemblies wherein each of the subassemblies comprise at least two planes having circuit traces disposed about an internal circuitized plane. The planes having circuit traces each have an external surface and an internal surface. Dielectric material is located between the planes. At least one via is disposed within each subassembly for providing electrical communication between the planes having circuit traces and electrical connection to another of the subassemblies. The vias are filled with bondable electrically conductive material. Dielectric is also provided on each external surface of each plane having circuit traces and having a via filled with a bondable electrically conductive material. The bondable electrically conductive material in the dielectric is aligned with and contacts the bondable electrically conductive material in the via in the planes having circuit traces for providing electrical connection to another of the subassemblies.

A joining layer is located between each of the subassemblies wherein the joining layer comprises dielectric layers disposed about an internal electrically conductive layer wherein the electrically conductive layer has a via and the dielectric layer each have a via of smaller diameter than the via in the electrically conductive layer and aligned with the via in the electrically conductive layer. The via in the dielectric layers and electrically conductive layers are filled with electrically bondable electrically conductive material for providing electrical connection between the subassemblies.

A conductive member is located between the joining layer and the subassemblies.

The structure is then laminated to cause bonding of the joining layer to the subassemblies.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference is made to the figures wherein the same numerals in different figures refer to the same or corresponding structures.

Figure 1:
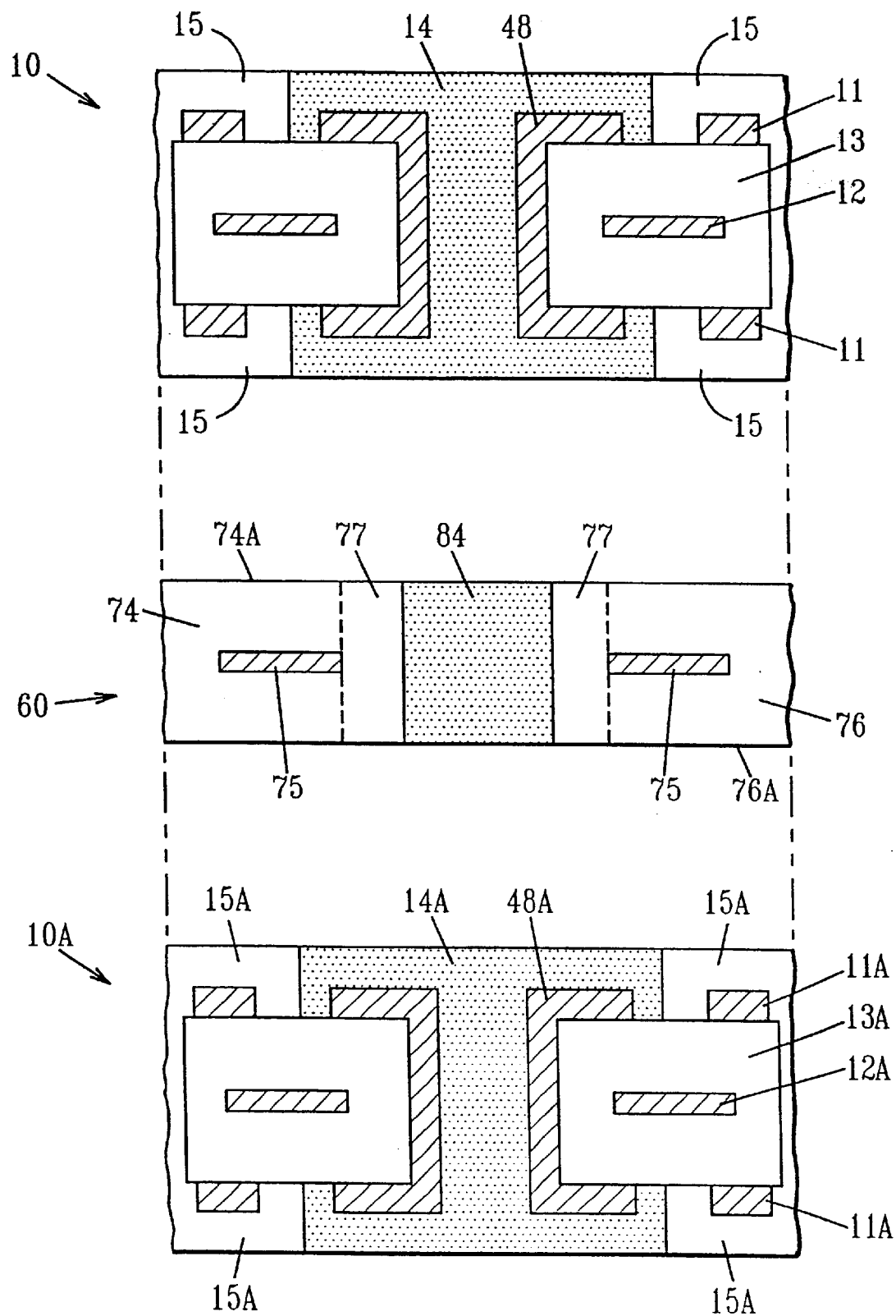
FIG. 1 illustrates a structure according to the present invention prior to laminating.

Reference to FIG. 1 illustrates two modularized circuitized plane subassemblies such as voltage planes 10, 10A. The subassemblies 10, 10A comprise at least two planes having circuit traces 11, 11A, for example signal planes, respectively disposed about an internal circuitized plane 12, 12A, respectively. The planes 12, 12A preferably can be voltage planes. The planes 11, 11A and 12, 12A are typically copper.

Dielectric material 13, 13A is located between the planes having circuit traces 11, 11A and planes 12, 12A. The dielectric material 13, 13A is typically any of the conventional dielectric materials used in fabricating signal and voltage planes such as epoxy glass compositions, FR-4 resins, polyfluorocarbons such as polytetrafluoroethylene, polyimides, polyamides, cyanate resins, and photoimageable materials such as an epoxy base material of the type described in U.S. Pat. No. 5,026,624 entitled "Composite for Photoimaging," disclosure of which is incorporated herein by reference. Any of these dielectrics may have continuous or non-continuous reinforcement, such as fiber glass, chopped glass, or particulate filled.

When the dielectric 13, 13A is a photoimageable dielectric, it is photoimaged or photopatterned, and developed to reveal the desired pattern and thereafter to provide a dielectric substrate with through holes 14, 14A on which metal circuit traces such as plated copper 11, 11A can be formed. The dielectric material may be curtain coated as described in U.S. Pat. No. 5,026,624 and can contain a thixotrope and be screen applied as described in U.S. Pat. No. 5,300,402 or it may be supplied as the dry film. The photoimageable material is photopatterned developed and fully cured and has thereon circuitry and through holes all as described in U.S. Pat. No. 6,204,453. Final cure of the photoimageable material provides a toughened base of dielectric on which electrical circuitry is formed.

An example of a specific photoimageable dielectric composition is prepared having a solids content of from about 86.5 to about 89%, such solids comprising: about 27.44% PKHC, a phenoxy resin; 41.16% of Epirez 5183. a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% FC 430, a fluorinated polyether nonionic surfactant from 3M Company; 3.85% Aerosil 380, an amorpous silicon dioxide from Degussa; to provide the solid content. A solvent was present from about 11 to about 13.5% of the total photoimageable dielectric composition.

The dielectric layers 13, 13A are typically about 2 mils to about 4 mils thick.

If desired, the vias can be plated with a conductive metal 48, 48A such as copper.

According to the present invention, the v vias are filled with a bondable electrically conductive material 14, 14A. Typical examples of bondable electrically conductive material are conductive pastes such as silver filled epoxy paste obtained from Dupont under the trade designation CB-100, Ablebond 8175 from Ablestick and filled polymeric systems, thermoset or thermoplastic type, containing transient liquid conductive particles or other metal particles such as gold, tin, palladium, copper, alloys, and combinations thereof. A particular example being coated copper paste. Metal coated polymeric particles disposed in a polymeric matrix can also be used. Other examples of suitable pastes can be found in U.S. Pat. No. 4,780,337, disclosure of which is incorporated herein by reference. Dielectric 15, 15A is also present on each external surface of each plane having circuit traces 11, 11A. Dielectric 15, 15A have a via, the diameter of which is greater than the diameter of the via through the planes having circuit traces 11, 11A and dielectric 12, 12A. This provides for increased tolerance for subsequent alignment with joining layer 60.

The vias in dielectric 15, 15A are also filled with the bondable electrically conductive material such as a conductive paste as disclosed above. The bondable electrically conductive material in dielectric 15. 15A is aligned with and contacts the bondable electrically conductive material in the vias in the planes having circuit traces for providing electrical connection to another of the subassemblies.

The vias in the planes having circuit traces, circuitized planes and dielectrics are typically filled with the bondable electrically conductive material in one step. The bondable electrically conductive material can be provided by stencil printing onto/into the vias.

A joining layer 60 comprising dielectric layers 74 and 76 disposed about an internal electrically conductive layer 75 such as copper. The dielectric layer 74 and 76 can be obtained from photoimageable dielectric material such as described above for the subassemblies 10, 10A and can be processed according to the technique used for subassemblies 10, 10A. A via 77 is provided through the electrically conductive layer 75. In addition, a via is provided through the dielectric layers 74, 76. The vias in the dielectric layers 74, 76 are aligned with the vias in the electrically conductive layer 75 and have a diameter that is smaller than the diameter in the electrically conductive layer. This difference in the diameters of the vias compensates for possible misalignment. The diameter of the via through the dielectric layers 74, 76 differ from that of the via through the layer 75 to provide the needed electrical isolation of the conductive layer 75 from the subsequently to be provided bondable electrically conductive material 84. Typically, the diameter of vias through the dielectric layers 74, 76 is about 1 to about 15 mils smaller than the diameter of the via through the conductive layer 75. The particular clearance will, of course, depend upon the particular dielectric and its ability to provide isolation. Such can be determined by those skilled in the art once aware of the present disclosure without undue experimentation.

The joining layer is typically about 2 to about 10 mils thick and more typically about 5 to about 8 mils thick.

The vias in the dielectric layers 74, 76 are filled with electrically bondable electrically conductive material 84 such as a conductive paste for providing electrical contact between subassemblies 10, 10A. The paste can be introduced into the vias by conventional techniques such as stencil printing, screen printing, injection, lamination or the like.

The joining layer 60 is located or sandwiched between and aligned with subassemblies 10, 10A.

The bondable electrically conductive material 84 is aligned with the bondable electrically conductive material 14, 14A.

In order to bond the joining layer 60 and subassemblies 10, 10A together, a photoimageable dielectric surface 74A and 76A that is bondable and curable is provided between joining layer 60 and subassemblies 10, 10A. In the embodiment illustrated in FIG. 1 the dielectric 74, 76 after being patterned is only partially cured, but to the extent that after being patterned the material will not flow into the holes.

In the alternative, the dielectric 74, 76 can be fully cured after being patterned by exposure to UV light and post baking; whereas, the dielectric 15, 15A is only partially cured to provide a curable bonding layer.

In addition, both the dielectric 74 and 76 of the joining layer and the dielectric 15, 15A of the subassemblies can be left at this stage in a partially cured stage.

Figure 2:
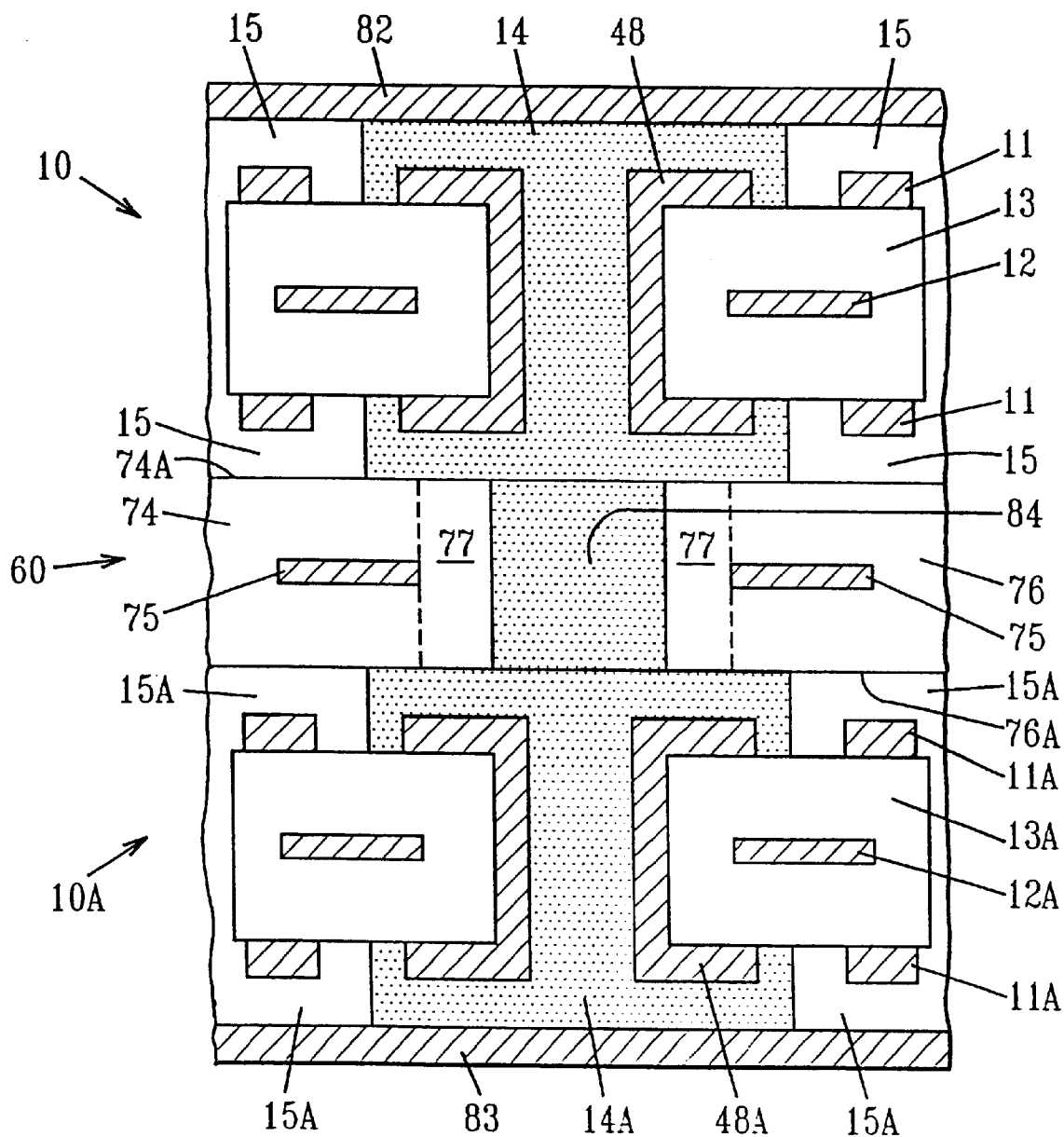
FIG. 2 illustrates a structure of the present invention after laminating.

The structure is then laminated to form the laminated circuit structure as illustrated in FIG. 2.

The laminating can be carried out at temperatures of about 70 to about 200° C. for about 30 to about 180 minutes and a pressure of about 50 to about 500 psi.

During lamination, the various sub-elements are bonded together and the bondable electrically conductive material forms electrical connection between the layers. Lamination also serves to fully cure the B-staged dielectric, where present, and bondable electrically conductive materials.

Figure 3:
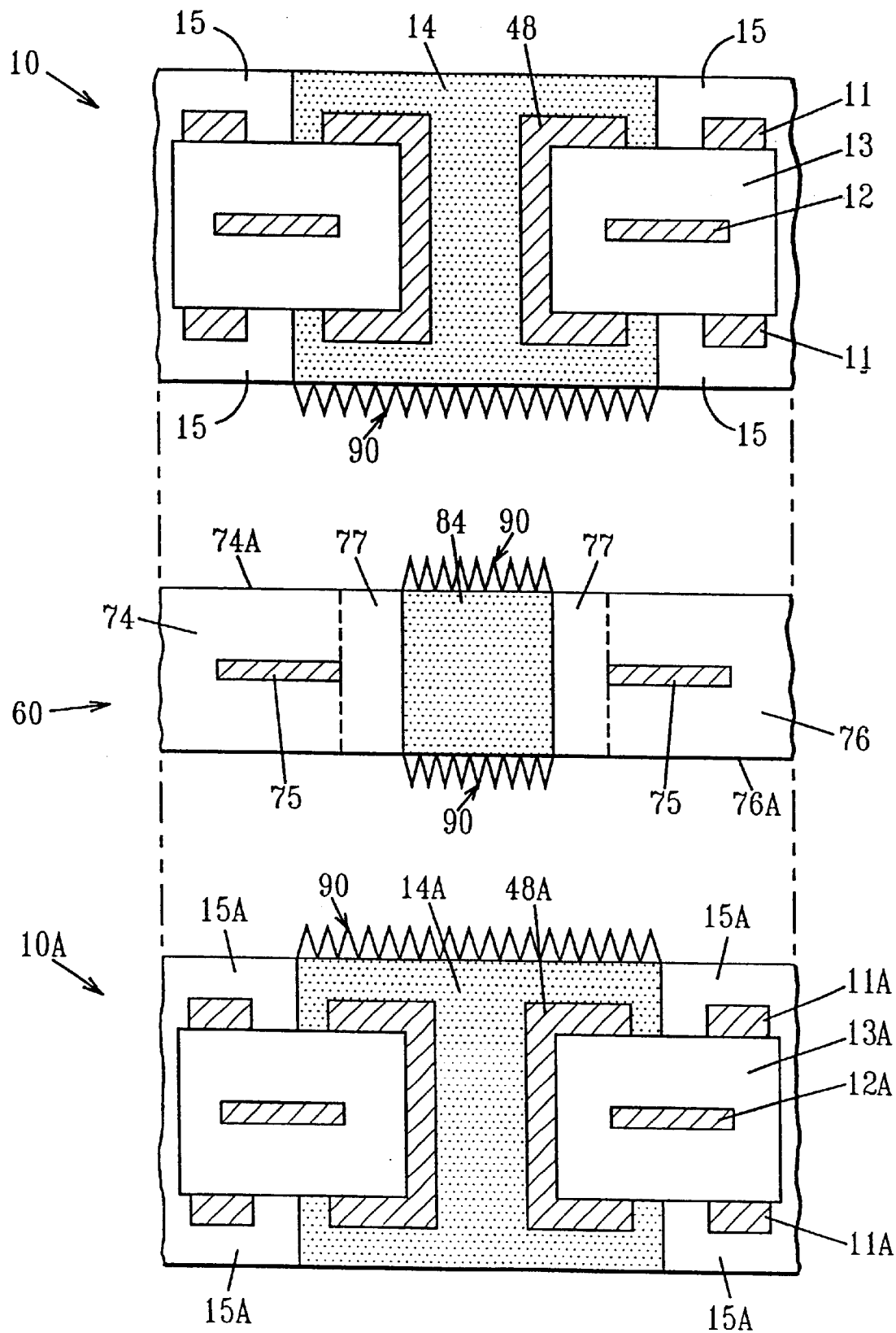
FIG. 3 illustrates another embodiment of the present invention prior to laminating.

FIG. 3 illustrates another embodiment of the present invention. The subassemblies 10, 10A and joining layer 60 are fabricated as described above for the embodiment in FIG. 1. In this embodiment the bondable electrically conductive material after stencil printed into the via is then cured by heating in a convention or IR oven. Also the dielectric layers are fully cured by UV exposure and post bake.

After this, dendrites 90 are then plated on the surfaces of the bondable electrically conductive material. Dendrite plating may be provided on all bondable electrically conductive material surfaces as shown in FIG. 3, or preferably, plating is carried out only on both surfaces of joining layer 60 at the locations of the bondable electrically conductive material.

Methods of providing dendrite platings are known such as those described in U.S. Pat Nos. 5,229,550; 5,435,057; and 5,509,200, disclosures of which are incorporated herein by reference.

As described above, the sub-elements are stacked, aligned and laminated. Electrical connection is established during lamination by either dendrite to dendrite or dendrite to bondable electrically conductive material contact.

FIG. 2 illustrates the finished laminate circuit structure formed by any of the methods described above as well as illustrating an embodiment both external surfaces of the voltage plane subassemblies are coated and processed with a photoimageable dielectric material 15, 15A. The photoimageable material 15, 15A is only partially cured to its B-stage. During stacking, thick copper foils 82 and 83 are applied to the bottom and top of the stack, respectively. This foil is then bonded to the B-staged photoimageable dielectric and the bondable electrically conductive material, to form a top and bottom circuit layer. This foil is then subtractively etched to form external pads and circuit lines that are in electrical contact with the rest of the multilayer circuit board. Because this foil surface is extremely planar, and there are no holes to tent with photoresist, and no copper plating is required, very fine line circuitry may be formed on these external surfaces.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for fabricating a laminate circuit structure assembly which comprises: providing at least two modularized circuitized plane subassemblies wherein each of the subassemblies comprise at least two planes having circuit traces having an external and internal surface disposed about an internal circuitized plane;

providing a dielectric material between the at least two planes and internal circuitized planes; and providing via disposed within each sub-assembly for providing electrical communication between the planes having circuit traces and electrical connection to another of the subassemblies; and providing dielectric on each external surface of each plane having circuit traces and having vias; wherein the vias are filled with bondable electrically conductive material wherein the bondable electrically conductive material in the vias in the dielectric contacts the bondable electrically conductive material in the planes having circuit traces for providing electrical connection to another of the subassemblies;

locating a joining layer between each of the subassemblies wherein the joining layer comprises dielectric layers disposed about an internal electrically conductive layer wherein the electrically conductive layer has a via and the dielectric layers each have a via of smaller diameter than vias in the electrically conductive layer and aligned with the vias in the electrically conductive layer; and wherein the vias in the dielectric layers and electrically conductive layer are filled with electrically bondable electrically conductive material for providing electrical contact between the subassemblies; and providing as a bonding member a bondable curable dielectric between the joining layer and subassemblies; and providing a conductive member for providing electrical interconnection between the joining layer and subassemblies; aligning the subassemblies, joining layer and bonding member; and then laminating to cause bonding of the joining layer to the subassemblies.

2. The method of claim 1 wherein the dielectric material is from a photoimageable material.

3. The method of claim 2 wherein the photoimageable material is exposed to prevent flow into holes.

4. The method of claim 1 wherein the dielectric material is from a non-photoimageable material.

5. The method of claim 1 wherein the vias through the planes having circuit traces are also plated with a conductive metal.

6. The method of claim 1 wherein the bondable electrically conductive material is a silver filled epoxy paste.

7. The method of claim 1 whereby the bondable electrically conductive material is a copper paste.

8. The method of claim 1 wherein the paste is cured prior to or during the laminating.

9. The method of claim 1 wherein the internal electrically conductive layer of the joining layer is copper.

10. The method of claim 1 wherein the joining layer is about 2 to about 10 mils thick.

11. The method of claim 1 wherein the bondable dielectric is present on the surfaces of the joining layer.

12. The method of claim 1 wherein the bondable dielectric is present on surfaces of the subassemblies.

13. The method of claim 1 wherein the bondable dielectric is present-on the surface of the joining layer and surfaces of the subassemblies.

14. The method of claim 1 wherein the conductive member comprises a dendrite layer for providing electrical interconnection between the subassembly and joining layer together.

15. The method of claim 1 wherein the conductive member comprises a conductive paste for providing electrical interconnection between the subassembly and joining layer together.

16. The method of claim 14 wherein the dendrite layer is present only on exposed surfaces of the bondable electrically conductive material of the joining layer.

17. The method of claim 14 wherein the dendrite layer is present on surfaces of the bondable electrically conductive material.

* * * * *